United States Patent
Groves

(10) Patent No.: US 7,463,112 B1
(45) Date of Patent: Dec. 9, 2008

(54) AREA EFFICIENT, DIFFERENTIAL T-COIL IMPEDANCE-MATCHING CIRCUIT FOR HIGH SPEED COMMUNICATIONS APPLICATIONS

(75) Inventor: Robert A. Groves, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/948,898

(22) Filed: Nov. 30, 2007

(51) Int. Cl.
*H03H 7/38* (2006.01)

(52) U.S. Cl. .......................... 333/33; 336/200; 336/220

(58) Field of Classification Search ................... 333/32, 333/33, 185, 177; 336/200, 223, 232, 220
See application file for complete search history.

(56) References Cited

U.S. PATENT DOCUMENTS

| | | | |
|---|---|---|---|
| 5,279,988 A | | 1/1994 | Saadat et al. |
| 5,451,914 A | * | 9/1995 | Stengel .......................... 333/25 |
| 5,884,990 A | | 3/1999 | Burghartz et al. |
| 6,008,714 A | | 12/1999 | Okuda et al. |
| 6,114,937 A | | 9/2000 | Burghartz et al. |
| 6,345,434 B1 | | 2/2002 | Anbo et al. |
| 6,362,716 B1 | | 3/2002 | Anbo et al. |
| 6,384,705 B1 | | 5/2002 | Huang et al. |
| 6,480,086 B1 | | 11/2002 | Kluge et al. |
| 6,713,162 B2 | | 3/2004 | Takaya et al. |

(Continued)

FOREIGN PATENT DOCUMENTS

JP 2000/261230 9/2000

(Continued)

OTHER PUBLICATIONS

Barth, C., et al., "An Embedded Broadband Impedance Matching Technique for Microstrip Patch Antennas," IEEE Antennas and Propagation Society, 2005; vol. 2B, p. 214-217.

(Continued)

*Primary Examiner*—Stephen E Jones
(74) *Attorney, Agent, or Firm*—Scully, Scott, Murphy & Presser, P.C.; Ira D. Blecker, Esq.

(57) ABSTRACT

An integrated circuit (IC) system provides a broadband impedance matching function in a minimal IC area for operation with an external high-speed differential communications channel. The IC system includes a first semi-conductive substrate with a first face and an oppositely disposed second face substantially parallel to the first face. A second non-conductive substrate having substantially parallel first and second faces is arranged upon the first substrate so that the first face of the first substrate contacts the second face of the second substrate. An integrated semiconductor circuit (IC) is disposed in the first substrate and intended for differential high-speed communications operation with the external high-speed differential communications channel. First and second planar conductors are disposed in the second substrate to be electrically isolated from each other and from the first substrate, and arranged for maximum mutual magnetic additive coupling between them. The first terminal ends of the conductors present differential channel connections to the external differential communications channel that display an impedance at the circuit substantially equal to the external differential high-speed communications channel over a broad range of frequencies from DC to about 10 GHz.

1 Claim, 2 Drawing Sheets

U.S. PATENT DOCUMENTS

| | | | |
|---|---|---|---|
| 6,717,503 | B2 | 4/2004 | Berthold et al. |
| 6,820,320 | B2 | 11/2004 | Anbo et al. |
| 6,859,130 | B2 | 2/2005 | Nakashima et al. |
| 6,967,555 | B2 | 11/2005 | Yu et al. |
| 7,170,349 | B2 | 1/2007 | Bhattacharjee et al. |
| 2003/0034867 | A1 | 2/2003 | Berthold et al. |
| 2003/0193386 | A1 | 10/2003 | Tseng et al. |
| 2006/0097835 | A1 | 5/2006 | Tomonari et al. |

FOREIGN PATENT DOCUMENTS

| | | |
|---|---|---|
| JP | 2006-173145 | 6/2006 |
| WO | WO 2007/019280 A2 | 2/2007 |

OTHER PUBLICATIONS

Chung, B. K., "Variability analysis of impedance matching network," Microelectronics Journal archive, vol. 37, Issue 11 (Nov. 2006), pp. 1419-1423.

Daniel, L., et al., "A Broadband Low-Noise-Amplifier".

Galal, S., et al., "Broadband ESD protection circuits in CMOS technology," in: Solid-State Circuits, IEEE Journal of, Publication Date: Dec. 2003, vol. 38, Issue: 12, pp. 2334-2340.

Guo, W.-D., et al., "Design of Wideband Impedance Matching for Through-Hole Via Transition Using Ellipse-Shaped Anti-Pad," in: Electrical Performance of Electronic Packaging, Publication Date: Oct. 2006, pp. 245-248.

LaMeres, B., et al., "Broadband Impedance Matching for Inductive Interconnect in VLSI Packages," IEEE International Conference on Computer Design, 2005, p. 683-688.

Langowski, Z., et al., "Design of broadband matching network for load impedance," Conference: MIKON 94—10th International microwave conference. AD Reports -NTIS- AD A, AD-A284 352, p. 327-331.

Li, RongLin., et al., "Broadband circularly polarized rectangular loop antenna with impedance matching," in: Microwave and Wireless Components Letters, IEEE [see also IEEE Microwave and Guided Wave Letters], Publication Date: Jan. 2006, vol. 16, Issue: 1, pp. 52-54.

McCalpin, W., "Broadband Impedance Matching Network Design Methodology for High Power Amplifiers," IEEE Topical Workshop on Power Amplifiers for Wireless Communications, 2002, p. 6.2.

Reiha, M.T., et al., "Symmetric Monolithic T-coils for Broadband IC Design," in: Microwave Symposium, 2007. IEEE/MTT-S International, Publication Date: Jun. 3-8, 2007, pp. 1909-1912.

Rogovin, D., et al., "Application of the Broadband Impedance Diagnostic/Prognostic Technique to Nuclear Power Plant Electric Cables," American Nuclear Society embedded topical meeting—International topical meeting, p. 135-151.

Rong, A., et al., "A Novel Effective Surface Impedance Formulation for Efficient Broadband Modeling of Lossy Thick Strip Conductors," IEEE MTTS International Microwave Symposium Digest, 2003; vol. 3, p. 1959-1962.

Selmi, L., et al., "Small-signal MMIC amplifiers with bridged T-coil matching networks," in: Solid-State Circuits, IEEE Journal of, Publication Date: Jul. 1992, vol. 27, Issue: 7, pp. 1093-1096.

Sussman-Fort, S.E., et al., "Matching network design using non-Foster impedances: Research Articles," International Journal of RF and Microwave Computer-Aided Engineering, vol. 16, Issue 2 (Mar. 2006), pp. 135-142.

Vandersteen, G., et al., "Broadband high-frequency hybrid," in: Instrumentation and Measurement, IEEE Transactions on, Publication Date: Dec. 2002, vol. 51, Issue: 6, pp. 1204-1209.

Yang, S.N., et al., "Broadband Impedance Matching Circuit Design Using Numerical Optimisation Techniques and Field Measurements," in: Power Line Communications and Its Applications, 2007. ISPLC '07. IEEE International Symposium on, Date: Mar. 26-28, 2007, pp. 425-430.

* cited by examiner

AREA EFFICIENT, DIFFERENTIAL T-COIL IMPEDANCE-MATCHING CIRCUIT FOR HIGH SPEED COMMUNICATIONS APPLICATIONS

BACKGROUND OF THE INVENTION

The present invention relates to high-speed communications applications, and more particularly relates to a differential T-coil impedance-matching circuit included in an integrated circuit (IC) system to match an impedance between the IC system's off-chip package (e.g., differential high-speed communications channel or circuit) and the on-chip circuitry required to interface and exchange data with the channel or off-chip package in a much reduced area within the IC comprising the IC system.

High-speed I/O circuits require an effective impedance match between an off-chip package and the on-chip circuitry to ensure efficient power transfer and signal integrity, particularly during differential high-speed I/O circuit applications. The off-chip package, referred to interchangeably herein as channel, high-speed channel, differential high-speed channel, circuit and like expressions, typically behaves as a transmission line with a real characteristic impedance ($Z_0$). In order to achieve a good impedance match between the off-chip package and the on-chip I/O circuit, the on-chip I/O circuit should present a real impedance that equals as close as possible to the package transmission line impedance ($Z_0$). Capacitive loading on-chip, however, tends to degrade the impedance match between the off-chip package and on-chip I/O circuit. The capacitive loading may derive from the on-chip I/O circuit and from electrostatic discharge (ESD) protection circuits, which are typically attached to the I/O pin to protect the I/O circuitry from ESD events. Conventional efforts and attempts to match such impedances include placing a termination resistor on-chip and attached to the I/O pin.

FIG. 1a herein depicts a conventional IC system 10 including an off-chip package or channel 15 and an on-chip I/O circuit 20 arranged for high-speed differential communications operation. The channel and on-chip I/O circuit are separated by a package/chip interface indicated by the dashed line 25. I/O circuit 20 includes two terminations, Rterm 1, Rterm 2, and two capacitive elements representing the capacitance of the on-chip circuitry including the capacitance of the ESD protection devices, Cload 1 and Cload 2. Rterm 1 and Cload 1 comprise a differential circuit receive/transmit circuit RX/TX 1, where Rterm 2 and Cload 2 comprise differential receive/transmit circuit RX/TX 2. Termination resistors Rterm 1, Rterm 2, are included in the on-chip circuit to match impedance of the on-chip circuit to the impedance of the off-chip package 15 (as mentioned above). While the frequency of operation (I/O data rate) is sufficiently low, the inherent I/O and ESD capacitances in parallel electrically with the termination resistors will have a relatively negligible effect on the impedance seen or present at the chip's I/O pin (as "seen" by the I/O channel). But as such frequency of operation increases, the I/O circuit and ESD capacitances degrade the impedance match between the channel and on-chip I/O circuitry. In such case, IC designers are compelled to implement I/O circuit design changes to ensure signal integrity, particularly for very high-speed I/O operations.

One known attempt at a solution to such impedance mismatch with increasing frequency of operation is to add an inductance to the on-chip circuit. FIG. 1b depicts a conventional I/O circuit 50 including 1:1 transformers in the form of conventional T-coils (T-coil 1, T-coil 2). Each of the T-coils includes a link to the off-chip package (channel) connected to firsts ends of a primary inductance $L_p$ and capacitance $C_{fb}$, where the other ends of same are connected through a second or secondary inductance $L_s$. The $L_p$ side of inductance $L_s$ is shown connected through a load capacitance to ground, and the $C_{fb}$ side of inductance $L_s$ is connected through Rterm1 to ground. The skilled artisan should note that FIG. 1b is a circuit model representation. The second T-coil (circuit model) is the equivalent to the first T-coil circuit (model). The coupling factors or coefficients between the primary and secondary inductances in each T-coil (between $L_s$ and $L_p$), are identified by constant K.

The added inductance (one T-coil comprising $L_p$ and $L_s$ for each side of the differential high-speed I/O circuit) has the effect of compensating out the capacitance with the increasing frequency of operation, essentially matching the impedance of the high-speed I/O circuit with that of the channel or package impedance. Various circuit layouts may be implemented to achieve such compensation (and impedance matching), including the T-coils 52, 54 (1:1 transformers) disposed between the I/O pin of the off-chip package or differential high-speed I/O channel and the I/O circuit including ESD protection.

Where conventional T-coils are used in conventional high-speed differential IC designs to improve the impedance match, the T-coils must be placed between the I/O pin (for example, at a C4 or wire bound pad) and the on-chip circuit. Doing so within an integrated circuit, however, requires fabricating the T-coils from available on-chip interconnect metallization(s). One particular T-coil design constraint is its dependency upon the size of the capacitance, or capacitive reactance that requires compensation. A larger capacitance requires a larger T-coil inductance for effective compensation. For modern communications channels, T-coil inductances on an order of 1 nH (composite inductance) are required to compensate the I/O circuit and ESD capacitances. T-coils of this size may require on-chip areas as large as 100 μm×100 μm to be cleared of all other circuitry and wiring channels.

This tradeoff of chip area available for functional circuitry and T-coil chip area can drive up the cost of the chip as a whole. In applications where the high-speed I/O channels are constructed for differential I/O operation, two T-coils (one T-coil for each half) are required per I/O circuit (per I/O channel interface), driving up the IC area required to accommodate the T-coils, therefore reducing area that could be available for other functional on-chip circuitry.

What would be desirable therefore in the art of integrated circuit (IC) design, including ICs and IC system designed for high-speed differential communications operations and applications is a differential T-coil impedance matching circuit that substantially matches the impedance between an IC's on-chip I/O circuitry and the off-chip package and channel, but which requires much less, and preferably one half (½) of the on-chip area typically required for fabrication to implement the T-coils, and their associated functional circuitry in an IC system.

OBJECTS AND SUMMARY OF THE INVENTION

It is therefore an object of the invention to provide a differential T-coil matching circuit, with stacked T-coils, integrated circuit (IC) and IC system constructed for use in high-speed communications channels that include such a novel differential T-coil matching circuit, etc., which overcomes the shortcomings of the prior art.

It is another object of the invention to provide a stacked differential T-coil matching circuit, and integrated circuit (IC) system constructed for use in high-speed communications that includes such a novel differential T-coil matching circuit, wherein the T-coils comprising a differential T-coil matching circuit are fabricated to be stacked on-chip without the large on-chip area consumption typically required for two (2) T-coils per channel, as evidenced by the conventional arts. The novel differential T-coil matching circuit and associated IC system includes and arranges the two T-coils to be coincident in a stacked relationship in the IC, or IC system, for the differential high-speed communications operation. This is readily distinguished from the conventional arrangement of the prior art, where such T-coils are arranged in independent, isolated positions (see FIG. 1b) within an IC requiring such match or impedance compensation.

More particularly, by arranging the two T-coils to be coincident (stacked) in the novel inventive integrated circuit system of this invention, the magnetic fields generated by each during normal data throughput operation combine in such a way that physically smaller T-coils may be used but the matching circuit nevertheless realizes an impedance or LC that sufficiently compensates for any impedance mismatch between the on-chip I/O circuitry and the differential channel, for improved high-speed I/O operation.

BRIEF DESCRIPTION OF THE DRAWING FIGURES

The foregoing and other objects, aspects and advantages will be better understood from the following detailed description of embodiments of the inventions, with reference to the drawings, in which.

DETAILED DESCRIPTION OF THE INVENTION

Figure 1A:
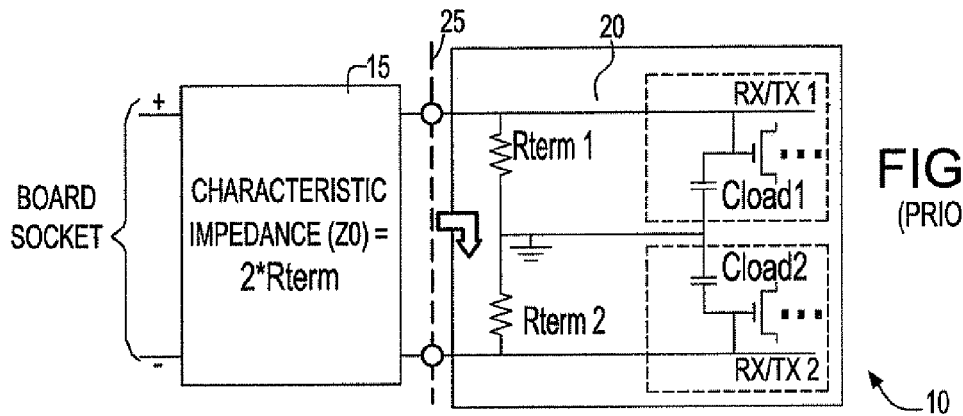
FIG. 1a depicts a portion of a conventional IC including an off-chip package and I/O circuit with ESD/circuit capacitances and resistive terminations, which are separated by a package/chip interface (PRIOR ART)
Figure 1B:
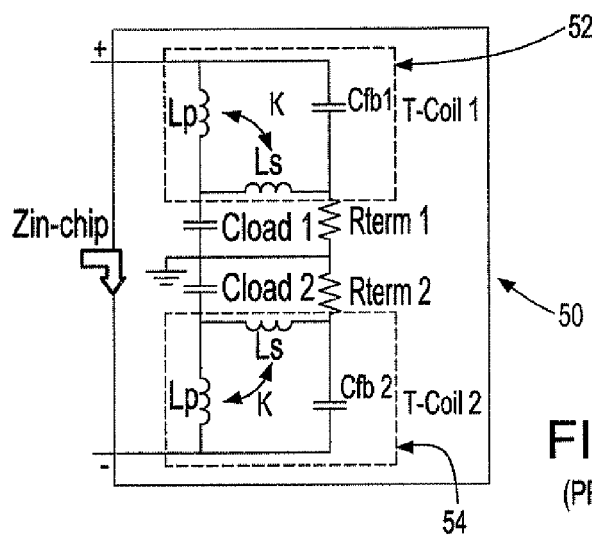
FIG. 1b depicts a portion of a conventional IC including an off-chip package and I/O circuit with isolated T-coils comprising conventional T-coil matching circuits including two (2) T-coils for differential communication channels (PRIOR ART)
Figure 2:
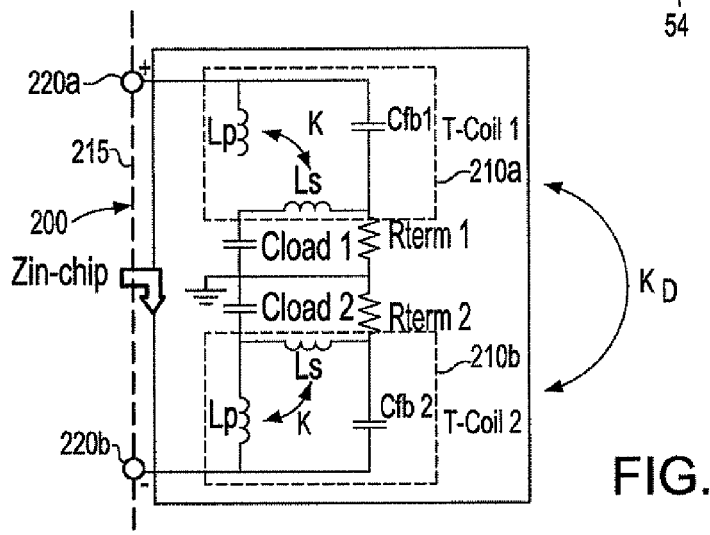
FIG. 2 depicts a novel differential T-coil matching circuit of the invention in the novel stacked T-coil arrangement.

A first embodiment of the novel, stacked differential T-coil matching circuit 200 for use in an inventive IC system of the invention is shown in FIG. 2. Differential T-coil matching circuit 200 as shown in FIG. 2 is comprised of two stacked T-coils 210a, 210b, each of which are connected to an off-chip package interface 215 at plus and minus terminals, 220a, 220b, respectively. T-coils 210a, 210b, are shown functionally in their stacked relationship to include inherent primary and secondary inductances, $L_p$ and $L_s$, and inherent capacitance $C_{fb}$. The T-coils 210a, 210b, are each connected to individual termination resistors Rterm 1, Reterm2, and Cload1, Cload2, to ground, as shown. Arranging the two T-coils in the matching circuit as shown facilitates magnetic or field coupling between the proximate (stacked) T-coils during normal circuit and I/O channel operation. For that matter, the novel T-coils arrangement reduces required inductance for each T-coil by as much as one half, which coupling is achieved by stacking the differential T-coils on top of each other.

Capacitors Cload 1, Cload 2, are representative of the capacitive load of the I/O circuitry that calls out for the inductive resonant compensation, this load comprising the capacitance of the ESD protection circuitry and the capacitance of the RX/TX circuitry. Each T-coil circuit (210a, 210b) shows a coefficient of coupling (K) between the primary and secondary inductances ($L_p$ and $L_s$). The FIG. 2 differential matching circuit arrangement arranges the two T-coils 210a, 210b, in close proximity to each other so that they are substantially coincident to leverage the inductance of one with the other by a coupling factor $K_D$. The inductive coupling allows for the reduction of inductance, the size of the T-coils, and therefore the chip area required to fabricate the T-coils by up to one-half that area required for isolated T-coils used in prior art matching circuits.

Figure 3A:
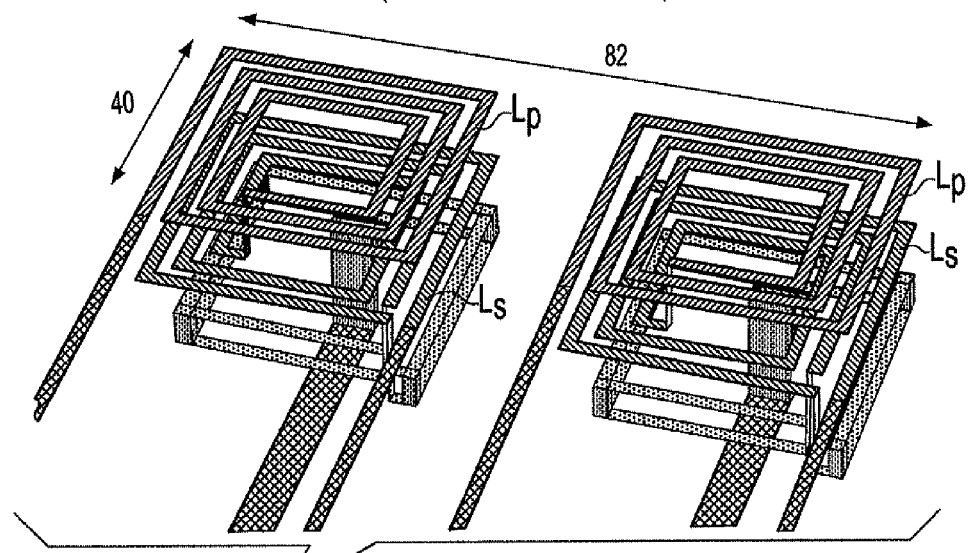
FIG. 3a depicts an exemplary layout and dimensions of a conventional pair of conductors for a dual T-coil arrangement (PRIOR ART)
Figure 3B:
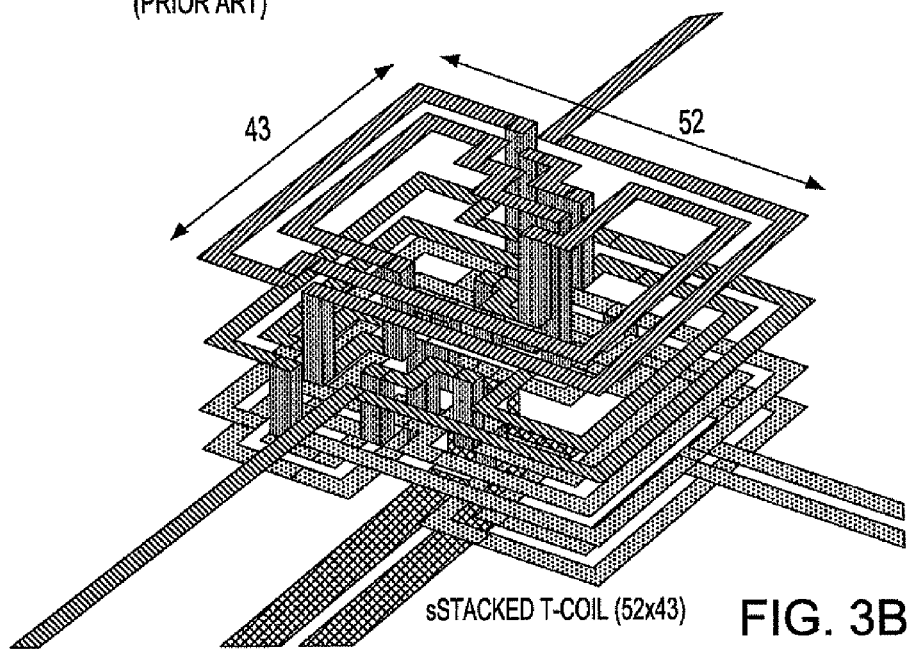
FIG. 3b depicts an exemplary layout and dimensions of one embodiment of a pair of stacked conductors comprising the novel T-coil matching circuit included in the IC system of the invention.

FIGS. 3a and 3b together provide a perspective comparison of a prior art layout for a pair of T-coils (FIG. 3a) fabricated within a semiconductor IC (only the conductors are shown, and $L_p$ and $L_s$ conductor portions identified) and a novel layout for a pair of T-coils to be arranged in a matching circuit in a novel IC system (FIG. 3b) constructed in accordance with the inventive principles herein for high-speed differential I/O circuit operation. The chip area required to accommodate the matching circuit T-coils (FIG. 3b) in their novel stacked arrangement is less than 70% of the surface area (in the units shown in both figures) required to implement the two conventional T-coils in the conventional T-coil layout of FIG. 3a.

That is, and as should be clear by a comparison of the chip areas of A and B, not only is less chip area required to implement the novel stacked arrangement of the novel differential T-coil matching circuit of the invention vis-à-vis required coil (conductor) geometry, but the smaller chip area required to implement the differential matching circuit conductors translates to a much smaller "keep-out" region about the matching circuitry, as should be understood by the skilled artisan.

The integrated circuit (IC) system may include that each conductor display a DC resistance in a range of between 0.5 Ohm and 30 Ohms, and may include first and second termination resistors disposed in one of the first and second substrates and arranged in the system so that a first end of the first resistor connects to the second terminal end of the first conductor, a second end of the first resistor connects to the virtual ground terminal of the circuit, a first end of the second termination resistor connects to the second terminal end of the second conductor and a second end of the second resistor connects to the virtual ground terminal of the circuit.

The integrated circuit (IC) system may include that a combined DC resistance of the first termination resistor, the second termination resistor and the first and second conductors is substantially equal to the real part of the impedance of the external differential high-speed communications channel. For that matter, the integrated circuit (IC) system may include that the circuit is constructed to provide a transmit (driver) function, and/or a receive function. The first and second conductors comprise spiral-like conductor patterns arranged to maximize a magnetic field intensity in each conductor during normal system operation, and a mutual magnetic coupling therebetween in the first and second conductors, and wherein the patterns consume a minimum area of the second substrate.

The first and second conductor spiral patterns may comprise substantially planar multi-level metal connections arranged in two or more planes within the second non-conductive substrate. The integrated circuit (IC) system may further include that the substantially planar multi-level connections of the first and second conductor spiral patterns are electrically isolated from other planar multi-level connections, but for singular electrical via interconnects that electrically connect each of the conductor planar levels. The first and second multi-level spiral conductors are interleaved in a substantially coaxial fashion to maximize mutual magnetic coupling between the conductors.

And while it is apparent that the invention herein disclosed is well calculated to fulfil the objectives stated above, it will be appreciated that numerous modifications and embodiments may be devised by those skilled in the art and it is intended that the appended claims cover all such modifications and embodiments as fall within the true spirit and scope of the present invention.

What is claimed is:

1. An integrated circuit (IC) system for providing a broadband impedance matching function in a minimal IC area for operation with an external high-speed differential communications channel, the IC system comprising:

a first semi-conductive substrate with a first face and an oppositely disposed second face substantially parallel to said first face;

a second non-conductive substrate having with substantially parallel first and second faces and arranged upon said first substrate so that the first face of said first substrate contacts the second face of said second substrate;

an integrated semiconductor circuit disposed in said first substrate and intended for differential high speed communications operation with the external high-speed differential communications channel, the circuit comprising a positive signal terminal, a negative signal terminal, and a virtual ground terminal held at an electrical potential that is halfway between an electrical potential of the positive and negative signal terminals, and wherein the electrical potential of the positive terminal is substantially 180 degrees out of phase with the electrical potential of the negative terminal; and first and second planar conductors, each conductor including a first terminal end, a second terminal end, and a middle terminal end and disposed in said second substrate to be electrically isolated from each other and from said first substrate, and arranged for maximum mutual magnetic additive coupling therebetween, wherein the middle terminal of the first conductor connects to a positive signal terminal of said internal differential high-speed communications circuit, the middle terminal of said second conductor connects to a negative terminal of said internal differential high-speed communications circuit, and wherein the first terminal ends of the conductors present differential channel connections to the external differential communications channel that display an impedance at the circuit substantially equal to said external differential high-speed communications channel over a broad range of frequencies from DC to about 10 GHz.

* * * * *